United States Patent
Zhang et al.

(10) Patent No.: US 12,068,391 B2
(45) Date of Patent: Aug. 20, 2024

(54) SEMICONDUCTOR DEVICE STRUCTURES AND METHODS OF MANUFACTURING THE SAME

(71) Applicant: INNOSCIENCE (SUZHOU) TECHNOLOGY CO., LTD., Suzhou (CN)

(72) Inventors: Anbang Zhang, Zhuhai (CN); King Yuen Wong, Zhuhai (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 782 days.

(21) Appl. No.: 17/257,299

(22) PCT Filed: Dec. 14, 2020

(86) PCT No.: PCT/CN2020/136048
§ 371 (c)(1),
(2) Date: Dec. 30, 2020

(87) PCT Pub. No.: WO2022/126309
PCT Pub. Date: Jun. 23, 2022

(65) Prior Publication Data
US 2022/0376083 A1    Nov. 24, 2022

(51) Int. Cl.
*H01L 29/66* (2006.01)
*H01L 29/20* (2006.01)
*H01L 29/778* (2006.01)

(52) U.S. Cl.
CPC .... *H01L 29/66462* (2013.01); *H01L 29/2003* (2013.01); *H01L 29/7786* (2013.01)

(58) Field of Classification Search
CPC ........... H01L 29/66462; H01L 29/2003; H01L 29/7786; H01L 29/1066; H01L 29/42316;
(Continued)

(56) References Cited

U.S. PATENT DOCUMENTS 5,376,812 A    12/1994   Oku
6,200,863 B1    3/2001   Xiang et al.
(Continued)

FOREIGN PATENT DOCUMENTS

CN   101647108 A    2/2010
CN   104022064 A    9/2014
(Continued)

OTHER PUBLICATIONS

International Search Report and Written Opinion of the corresponding PCT application No. PCT/CN2020/136048 mailed on Sep. 13, 2021.

(Continued)

*Primary Examiner* — Cuong B Nguyen
(74) *Attorney, Agent, or Firm* — JCIPRNET

(57) ABSTRACT

Semiconductor device structures and methods for manufacturing the same are provided. The semiconductor device structure includes a substrate, a first nitride semiconductor layer, a second nitride semiconductor layer, a gate structure, a first spacer, a second spacer and a drain electrode. The first nitride semiconductor layer is disposed on the substrate. The second nitride semiconductor layer is disposed on the first nitride semiconductor layer. The gate structure is disposed on the second nitride semiconductor layer. The first spacer is disposed adjacent to a first surface of the gate structure. The second spacer is disposed adjacent to a second surface of the gate structure. The drain electrode is disposed relatively adjacent to the second spacer than the first space. The first spacer has a first length, and the second spacer has a second length greater than the first length along the first direction.

16 Claims, 11 Drawing Sheets

(58) Field of Classification Search
CPC .............. H01L 29/7787; H01L 29/401; H01L 29/42312; H01L 29/15–158; H01L 29/122–127; H01L 29/778–7789; H01L 2924/13064; H01L 29/66431
See application file for complete search history.

(56) References Cited

U.S. PATENT DOCUMENTS

| | | |
|---|---|---|
| 9,449,833 B1 | 9/2016 | Regan et al. |
| 2010/0025744 A1 | 2/2010 | Miyashita et al. |
| 2010/0078736 A1 | 4/2010 | Hoentschel et al. |
| 2017/0178914 A1 | 6/2017 | Prasad et al. |
| 2018/0204916 A1* | 7/2018 | Shimizu .............. H01L 29/7786 |
| 2020/0176595 A1 | 6/2020 | Otake et al. |
| 2020/0321466 A1 | 10/2020 | Cortes et al. |
| 2020/0388541 A1 | 12/2020 | Waite |

FOREIGN PATENT DOCUMENTS

| | | |
|---|---|---|
| CN | 111682065 A | 9/2020 |
| JP | 5136165 A | 6/1993 |

OTHER PUBLICATIONS

First Office Action of the corresponding China patent application No. 202080005344.5 mailed on May 24, 2022.

* cited by examiner

SEMICONDUCTOR DEVICE STRUCTURES AND METHODS OF MANUFACTURING THE SAME

BACKGROUND

1. Field of the Disclosure

The present disclosure relates to a semiconductor device structure and more particularly to a semiconductor device structure including a spacer structure.

2. Description of Related Art

Components including direct bandgap semiconductors, such as, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a gate structure, a first spacer, a second spacer and a drain electrode. The first nitride semiconductor layer is disposed on the substrate. The second nitride semiconductor layer is disposed on the first nitride semiconductor layer and has a bandgap greater than that of the first nitride semiconductor layer. The gate structure is disposed on the second nitride semiconductor layer. The gate structure has a first surface and a second surface opposite to the first surface. The first spacer is disposed adjacent to the first surface of the gate structure. The second spacer is disposed adjacent to the second surface of the gate structure. The drain electrode is disposed relatively adjacent to the second spacer than the first space. The first spacer has a first length along a first direction parallel to an interface between the first nitride semiconductor layer and the second nitride semiconductor layer, and the second spacer has a second length greater than the first length along the first direction.

According to some embodiments of the present disclosure, a semiconductor device structure includes a substrate, a first nitride semiconductor layer, a second nitride semiconductor layer, a gate structure and a first spacer. The first nitride semiconductor layer is disposed on the substrate. The second nitride semiconductor layer is disposed on the first nitride semiconductor layer and has a bandgap greater than that of the first nitride semiconductor layer. The gate structure is disposed on the second nitride semiconductor layer. The gate structure has a first surface and a second surface opposite to the first surface. The first spacer is disposed adjacent to the first surface of the gate structure and includes a first dopant. The first spacer has a first portion and a second portion on the first portion, and first dopant has a greater concentration in the upper portion than the lower portion.

According to some embodiments of the present disclosure, a method of manufacturing a semiconductor device structure includes: forming a first nitride semiconductor layer on the substrate; forming a second nitride semiconductor layer on the first nitride semiconductor layer, wherein the second nitride semiconductor layer has a bandgap greater than that of the first nitride semiconductor layer; forming a gate structure on the second nitride semiconductor layer, wherein the gate structure has a first surface and a second surface opposite to the first surface; forming a first spacer on the first surface of the gate structure; and a second spacer on the second surface of the gate structure, wherein the first spacer has a first length along a first direction parallel to an interface between the first nitride semiconductor layer and the second nitride semiconductor layer, and the second spacer has a second length greater than the first length along the first direction.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
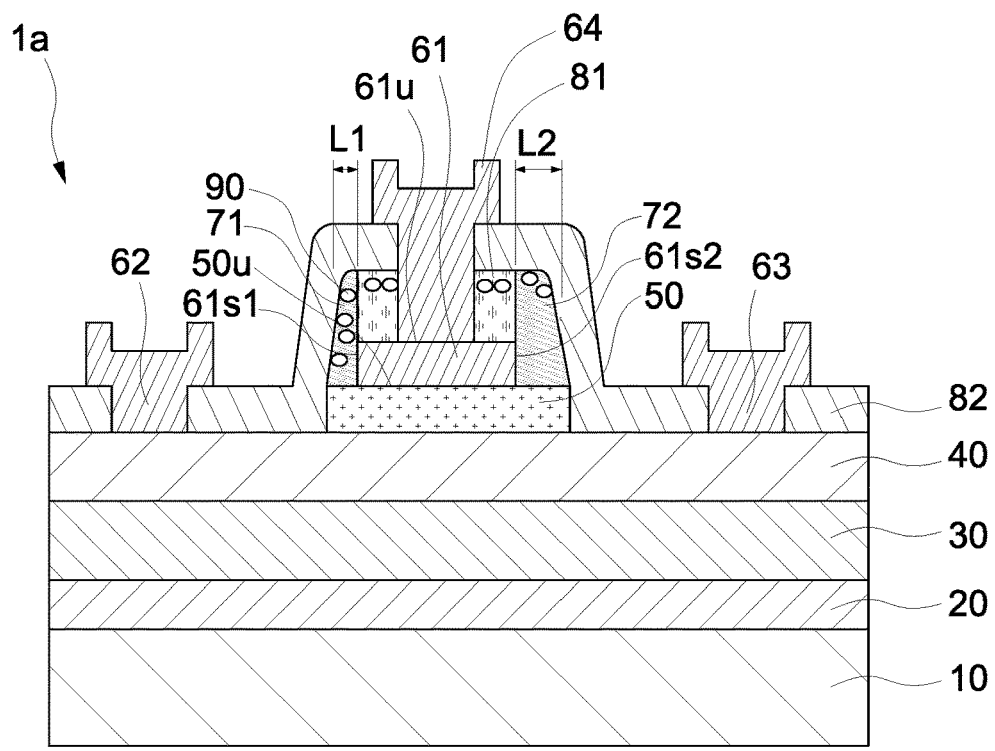
FIG. 1 is a cross-sectional view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including an asymmetry spacer structure. The asymmetry spacer structure may assisting in forming a depletion layer with an asymmetry structure. The semiconductor device structure of the present disclosure can be applied in, without limitation, HEMT devices, especially in low voltage HEMT devices, high voltage HEMT devices and radio frequency (RF) HEMT devices.

FIG. 1 is a cross-sectional view of a semiconductor device structure 1a in accordance with some embodiments of the present disclosure.

The semiconductor device structure 1a may include a substrate 10, a buffer layer 20, a nitride semiconductor layer 30, a nitride semiconductor layer 40, a nitride semiconductor layer 50, a gate structure 61, an electrode 62, an electrode 63, an electrode 64, a spacer 71, a spacer 72, a mask layer 81 and a passivation layer 82.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The buffer layer 20 may be disposed on the substrate 10. The buffer layer 20 may be configured to reduce defect due to the dislocation between the substrate 10 and the nitride semiconductor layer 30. The buffer layer 20 may include, but is not limited to, nitride, such as AN, AlGaN or the like.

The nitride semiconductor layer 30 (or a channel layer) may be disposed on the buffer layer 20. The nitride semiconductor layer 30 may include a group III-V layer. The nitride semiconductor layer 30 may include, but is not limited to, a group III nitride, for example, a compound $In_aAl_bGa_{1-a-b}N$, in which $a+b≤1$. The group III nitride further includes, but is not limited to, for example, a compound $Al_aGa_{(1-a)}N$, in which $a≤1$. The nitride semiconductor layer 30 may include a gallium nitride (GaN) layer. GaN has a bandgap of about 3.4 eV. The thickness of the nitride semiconductor layer 30 may range, but is not limited to, from about 0.1 μm to about 1 μm.

The nitride semiconductor layer 40 (or a barrier layer) may be disposed on the nitride semiconductor layer 30. The nitride semiconductor layer 40 may include a group III-V layer. The nitride semiconductor layer 40 may include, but is not limited to, a group III nitride, for example, a compound $In_aAl_bGa_{1-a-b}N$, in which $a+b≤1$. The group III nitride may further include, but is not limited to, for example, a compound $Al_aGa_{(1-a)}N$, in which $a≤1$. The nitride semiconductor layer 40 may have a greater bandgap than that of the nitride semiconductor layer 30. The nitride semiconductor layer 40 may include an aluminum gallium nitride (AlGaN) layer. AlGaN has a bandgap of about 4.0 eV. The thickness of the nitride semiconductor layer 40 may range, but is not limited to, from about 10 nm to about 100 nm.

A heterojunction is formed between the nitride semiconductor layer 40 and the nitride semiconductor layer 30, and the polarization of the heterojunction forms a two-dimensional electron gas (2DEG) region in the nitride semiconductor layer 30.

The nitride semiconductor layer 50 (or a depletion layer) may be disposed on the nitride semiconductor layer 40. The nitride semiconductor layer 50 may be in direct contact with the nitride semiconductor layer 40. The nitride semiconductor layer 50 may be doped with impurities. The nitride semiconductor layer 50 may include p-type dopants. It is contemplated that the nitride semiconductor layer 50 may include a p-doped GaN layer, p-doped AlGaN layer, p-doped AlN layer or other suitable III-V group layers. The p-type dopants may include magnesium (Mg), beryllium (Be), zinc (Zn) and cadmium (Cd).

The nitride semiconductor layer 50 may be configured to control the concentration of the 2DEG in the nitride semiconductor layer 30. The nitride semiconductor layer 50 can be used to deplete the 2DEG directly under the nitride semiconductor layer 50.

The gate structure 61 may be disposed on the nitride semiconductor layer 50. The gate structure 61 may cover a portion of the nitride semiconductor layer 50. A portion of the nitride semiconductor layer 50 may be exposed from the gate structure 61. The gate structure 61 may be disposed between the electrode 62 and the electrode 63. The gate structure 61 may include a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. The gate structure 61 may have a surface $61s1$ (or a side surface) adjacent to the electrode 62. The gate structure 61 may have a surface $61s2$ (or a side surface) adjacent to the electrode 63.

The electrode 62 (or a source electrode) may be disposed on the nitride semiconductor layer 40. The electrode 62 may be in contact with the nitride semiconductor layer 40. The electrode 62 may include, for example, without limitation, a conductive material. The conductive material may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 62 may include a multilayer structure. For example, the electrode 62 may include a structure of two layers of different material. The electrode 62 may include a structure of three layers, two adjacent layers of which are made of different materials. The electrode 62 may be electrically connected to ground. The electrode 62 may be electrically connected to a virtual ground. The electrode 62 may be electrically connected to real ground.

The electrode 63 (or a drain electrode) may be disposed on the nitride semiconductor layer 40. The electrode 63 may be disposed relatively adjacent to the spacer 72 than the spacer 71. The electrode 63 may be in contact with the nitride semiconductor layer 40. The electrode 63 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN, or other suitable materials. The electrode 63 may have a structure similar to or the same as that of the electrode 62.

The mask layer 81 may be disposed on the gate structure 61. The mask layer 81 may be disposed on the surface 61u (or an upper surface) of the gate structure 61. The mask layer 81 may be disposed between the spacer 71 and the spacer 72. The mask layer 81 may include a dielectric material. For example, the mask layer 81 may include nitride, oxide, oxynitride or other suitable materials.

The spacer 71 may be disposed on the nitride semiconductor layer 50. The spacer 71 may be in contact with an upper surface 50u of the nitride semiconductor layer 50. The spacer 71 may terminate on the upper surface 50u of the nitride semiconductor layer 50. The spacer 71 may not extend to a side surface of the nitride semiconductor layer 50. The spacer 71 may be disposed adjacent to the surface 61s1 of the gate structure 61. The spacer 71 may be disposed on the surface 61s1 of the gate structure 61. The spacer 71 may be in contact with the surface 61s1 of the gate structure 61. The spacer 71 may be disposed on a side surface of the mask layer 81. The spacer 71 may include a dielectric material. For example, the spacer 71 may include nitride, oxide, oxynitride or other suitable materials. The spacer 71 may include nitride, such as silicon nitride and aluminum nitride. The material of the spacer 71 may not be the same as that of the mask layer 81.

The spacer 72 may be disposed on the nitride semiconductor layer 50. The spacer 72 may be separated from the spacer 71. The spacer 72 may be in contact with the upper surface 50u of the nitride semiconductor layer 50. The spacer 72 may terminate on the upper surface 50u of the nitride semiconductor layer 50. The spacer 72 may not extend to a side surface of the nitride semiconductor layer 50. The spacer 72 may be disposed adjacent to the surface 61s2 of the gate structure 61. The spacer 72 may be in contact with the surface 61s2 of the gate structure 61. The spacer 72 may be disposed on the surface 61s2 of the gate structure 61. The spacer 72 may be disposed on a side surface of the mask layer 81. The spacer 72 may include a dielectric material. For example, the spacer 72 may include nitride, oxide, oxynitride or other suitable materials. The spacer 71 may include nitride, such as silicon nitride. The material of the spacer 72 may not be the same as that of the mask layer 81. The material of the spacer 72 may be the same as that of the spacer 71.

The passivation layer 82 may be disposed on the gate structure 61. The passivation layer 82 may be disposed on the mask layer 81. The passivation layer 82 may be disposed on the spacer 71. The passivation layer 82 may be disposed on the spacer 72. The passivation layer 82 may be disposed on an upper surface of the nitride semiconductor layer 40. The passivation layer 82 may be conformally formed on an upper surface of the mask layer 81, a side surface of the spacer 71, a side surface of the spacer 72 and the upper surface of the nitride semiconductor layer 40. The passivation layer 82 may include a dielectric material. For example, the passivation layer 82 may include nitride, oxide, oxynitride or other suitable materials. The mask layer 81 may include oxide, such as silicon oxide. The material of the passivation layer 82 may not be the same as that of the mask layer 81. The material of the passivation layer 82 may not be the same as that of the spacer 71. The material of the passivation layer 82 may not be the same as that of the spacer 72.

The spacer 71 may include dopant(s) 90 therein. The dopant(s) may be used to, for example, modify etching rate. The dopant(s) may be used to, for example, increase the difference of etching rate between the spacer 71 and the spacer 72. The dopant(s) 90 may include boron (B). The dopant(s) 90 may include aluminum (Al). The dopant(s) 90 may include fluoride (F). The dopant(s) 90 may include chloride (Cl). The dopant(s) 90 may include iodide. The dopant(s) 90 may include carbon (C). The dopant(s) 90 may include silicon (Si). The dopant(s) 90 may include gallium (Ga). The dopant(s) 90 may include germanium (Ge). The dopant(s) 90 may include antimony (Sb). The dopant(s) 90 may include indium (In). The dopant(s) 90 may include phosphorus (P). The dopant(s) 90 may include dopant(s) combination thereof.

The spacer 72 may include dopant(s) 90 therein. The concentration of the dopant(s) 90 in the spacer 71 may be different from the concentration of the dopant(s) 90 in the spacer 72 such that the spacer 71 may have an etching rate different from that of the spacer 72 under an etching technique. The concentration of the dopant(s) in the spacer 71 may be defines as the total amount of dopants in the whole spacer 71. The concentration of the dopant(s) in the spacer 72 may be defines as the total amount of dopants in the whole spacer 72. The concentration of the dopant(s) 90 in the spacer 71 may be greater than the concentration of the dopant(s) 90 in the spacer 72. The spacer 71 may have a greater etching rate than that of the spacer 72 under an etching technique.

The mask layer 81 may include dopant(s) 90 therein. The concentration of the dopant(s) 90 in the mask layer 81 may be different from the concentration of the dopant(s) 90 in the spacer 71. The concentration of the dopant(s) 90 in the spacer 71 may be greater than the concentration of the dopant(s) 90 in the mask layer 81.

Figure 1A:
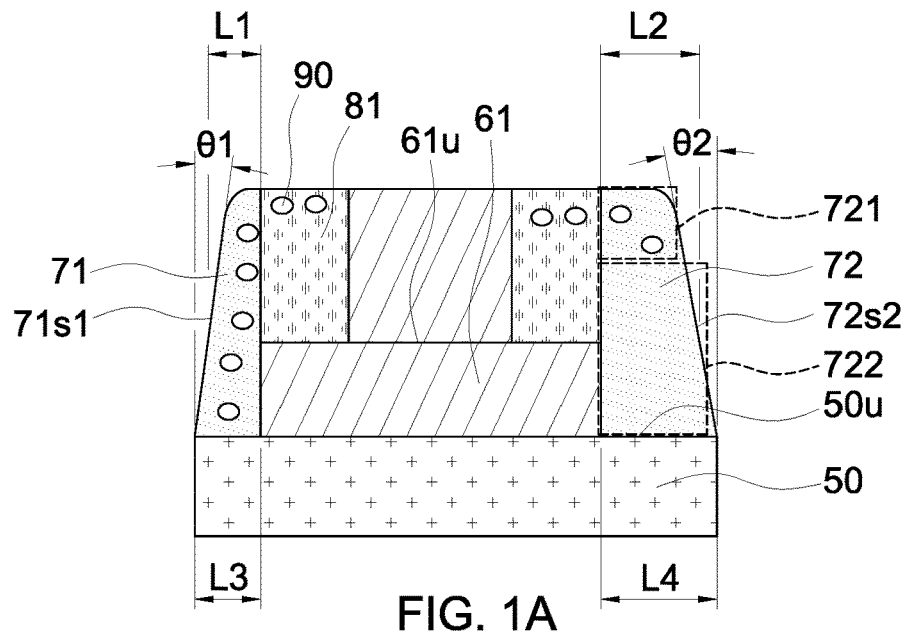
FIG. 1A is a partial enlarged view of the semiconductor device structure of FIG. 1.

FIG. 1A is a partial enlarged view of the semiconductor device structure 1a of FIG. 1. As shown in FIG. 1A, the profile of the spacer 71 may be different from the profile of the spacer 72. The aspect ratio of the spacer 71 may be different form that of the spacer 72. The spacer 71 may have a length L1. The length L1 may be defines as a length measured along a direction parallel to an interface between the nitride semiconductor layer 30 and the nitride semiconductor layer 40. The length L1 may be measured at an elevation substantially the same as that of the surface 61u of the gate structure 61. The spacer 72 may have a length L2. The length L2 may be defines as a length measured along the direction parallel to the interface between the nitride semiconductor layer 30 and the nitride semiconductor layer 40. The length L2 may be measured at an elevation substantially the same as that of the surface 61u of the gate structure 61. The length L1 may be different from the length L2. The length L2 may be greater than the length L1.

The spacer 71 may have a surface 71s1 facing the electrode 62. The spacer 72 may have a surface 72s1 facing the electrode 63. An angle θ1 between the surface 71s1 and an imaginary line along a direction orthogonal to the interface between the nitride semiconductor layer 30 and the nitride semiconductor layer 40 may be less an angle θ2 between the surface 72s1 and the imaginary line alone the direction orthogonal to the interface between the nitride semiconductor layer 30 and the nitride semiconductor layer 40. The surface 71s1 may be steeper than the surface 72s1.

The spacer 72 may include a portion 721 and a portion 722. The portion 722 may be in contact with a surface 50u of the nitride semiconductor layer 50. The portion 721 may be disposed above the portion 722. The concentration of the dopant(s) 90 in the portion 721 may be different from that in the portion 722. The concentration of the dopant(s) 90 in the portion 721 may be greater than that in the portion 722.

The dopant(s) 90 may assist in forming the semiconductor device structure 1a which has an asymmetry structure. For example, the profile of the spacer 71 is different from the profile of the spacer 72, which may result in forming the nitride semiconductor layer 50 with an asymmetry structure. The nitride semiconductor layer 50 may have a portion, with a length L3, protruding from the gate structure 61 towards the electrode 62. The nitride semiconductor layer 50 may have another portion, with a length L4, protruding from the gate structure 61 towards the electrode 63. The length L3 may be proportional to the length L1. The length L4 may be proportional to the length L2. The length L1 and the length L2 may be modified by the injection of the dopant(s) 90 in the spacer 71 and in the spacer 72, respectively. Therefore, the injection of the dopant(s) 90 may result in forming the nitride semiconductor layer 50 with an asymmetry structure.

Figure 2:
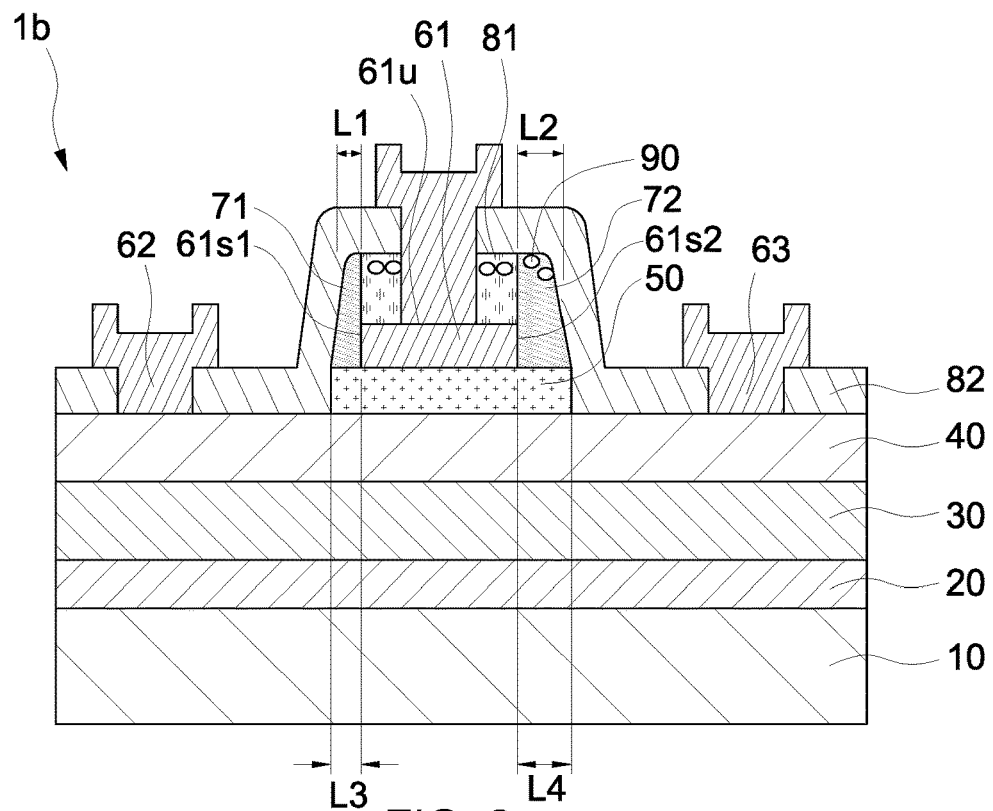
FIG. 2 is a cross-sectional view of a semiconductor device structure in accordance with some embodiments of the present disclosure.

FIG. 2 is a cross-sectional view of a semiconductor device structure 1b in accordance with some embodiments of the present disclosure. The semiconductor device structure 1b may have a structure similar to the semiconductor device structure 1a except for the concentration of the dopant(s) 90 in the spacer 71. The concentration of the dopant(s) 90 in the spacer 72 may be greater than that in the spacer 71. The concentration of the dopant(s) 90 in the mask layer 81 may be greater than that in the spacer 71. The spacer 71 may substantially include no dopant(s).

Figure 3:
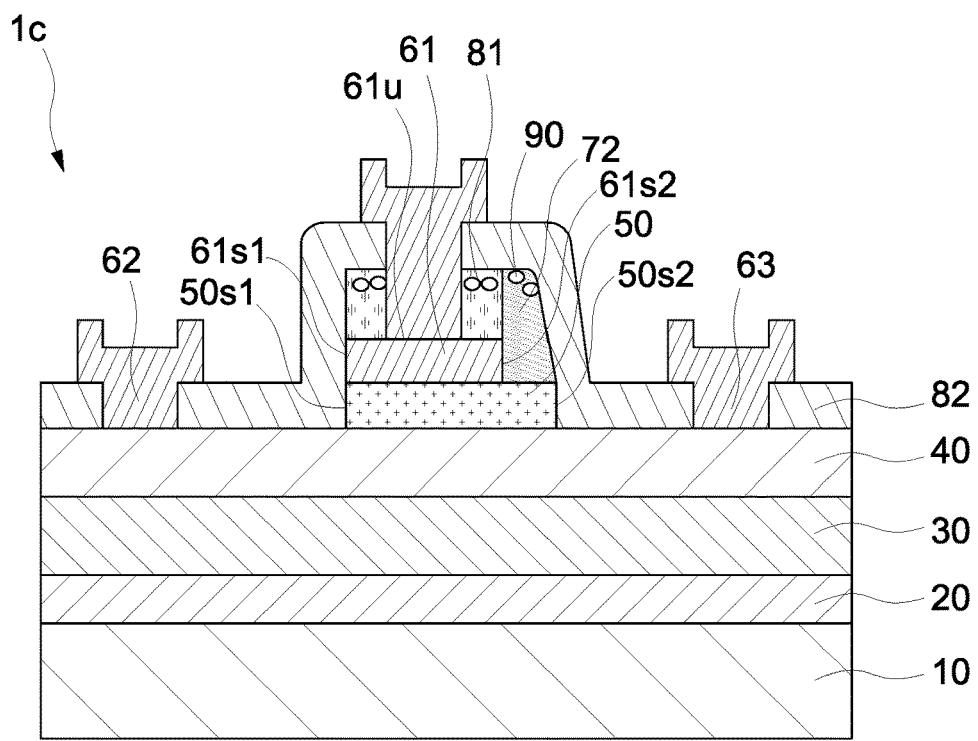
FIG. 3 is a cross-sectional view of a semiconductor device structure in accordance with some embodiments of the present disclosure.

FIG. 3 is a cross-sectional view of a semiconductor device structure 1c in accordance with some embodiments of the present disclosure. The semiconductor device structure 1c may have a structure similar to the semiconductor device structure 1a except for the spacer 71. The spacer 71 may be removed such that the passivation layer 82 may be in contact with the gate structure 61. The surface 61s1 of the gate structure 61 may be substantially coplanar with the surface 50s1 (or a side surface) of the nitride semiconductor layer 50. The surface 61s2 of the gate structure 61 may not be substantially coplanar with the surface 50s2 (or a side surface) of the nitride semiconductor layer 50.

Figure 4:
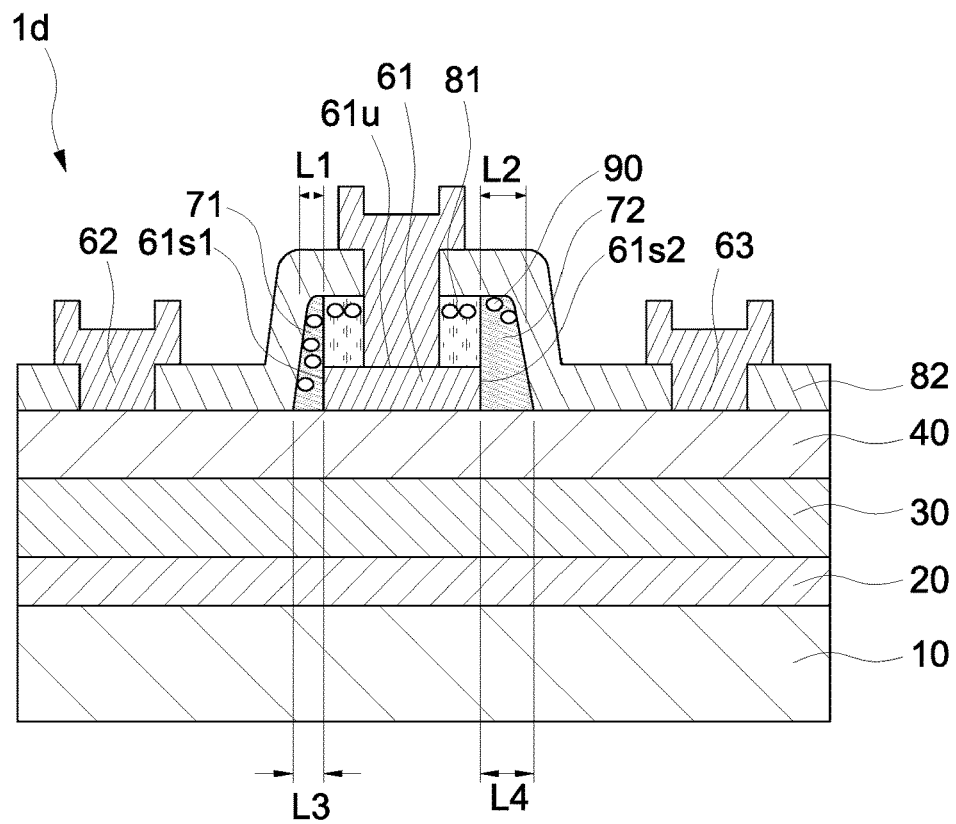
FIG. 4 is a cross-sectional view of a semiconductor device structure in accordance with some embodiments of the present disclosure.

FIG. 4 is a cross-sectional view of a semiconductor device structure 1d in accordance with some embodiments of the present disclosure. The semiconductor device structure 1d may have a structure similar to the semiconductor device structure 1a except for the nitride semiconductor layer 50. The semiconductor device structure 1d may be a depletion-mode HEMT. The gate structure 61 may be in contact with the nitride semiconductor layer 40. The spacer 71 may be in contact with the nitride semiconductor layer 40. The spacer 72 may be in contact with the nitride semiconductor layer 40.

FIG. 5A, FIG. 5B, FIG. 5C, FIG. 5D, FIG. 5E, FIG. 5F, FIG. 5G and FIG. 5H illustrate various stages of a method for manufacturing a semiconductor device structure in accordance with some embodiments of the present disclosure.

Figure 5A:
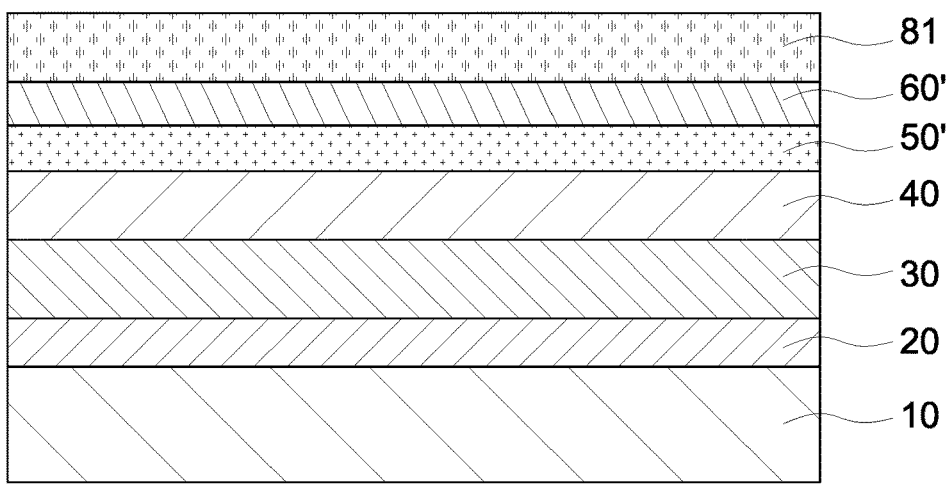
FIG. 5A, FIG. 5B, FIG. 5C, FIG. 5D, FIG. 5E, FIG. 5F, FIG. 5G and FIG. 5H illustrate various stages of a method for manufacturing a semiconductor device structure in accordance with some embodiments of the present disclosure.

Referring to FIG. 5A, a substrate 10 is provided. A buffer layer 20, a nitride semiconductor layer 30, a nitride semiconductor layer 40, a semiconductor material 50', a gate material 60' and a mask layer 81 may be formed on the substrate 10.

Figure 5B:
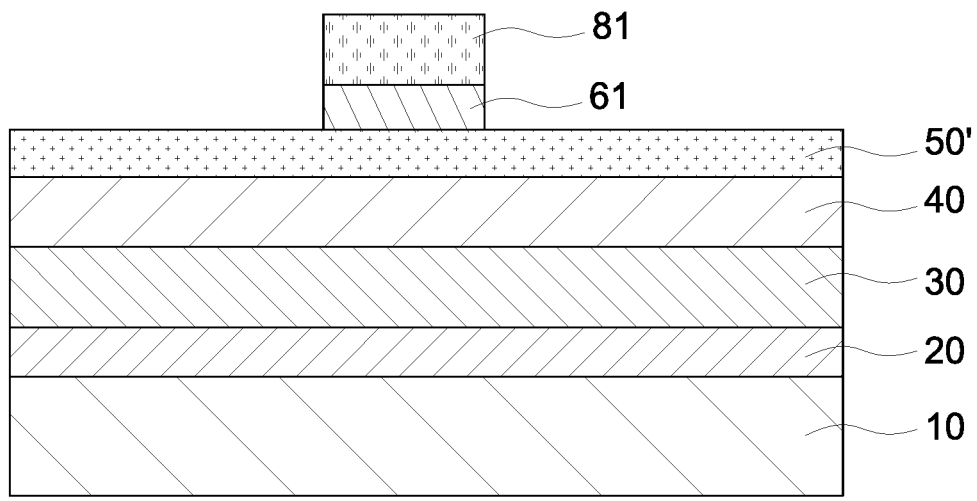

Referring to FIG. 5B, the gate material 60' and the mask layer 81 may be patterned, and a gate structure 61 may be formed. The mask layer 81 may cover the gate structure 61.

Figure 5C:
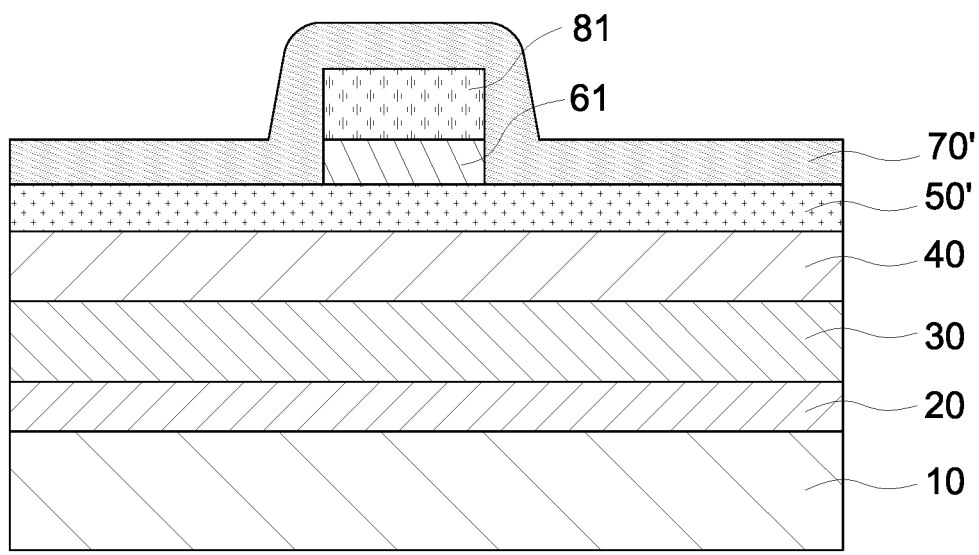

Referring to FIG. 5C, a dielectric layer 70' may be formed to cover the nitride semiconductor layer 40, the gate structure 61 and the mask layer 81.

Figure 5D:
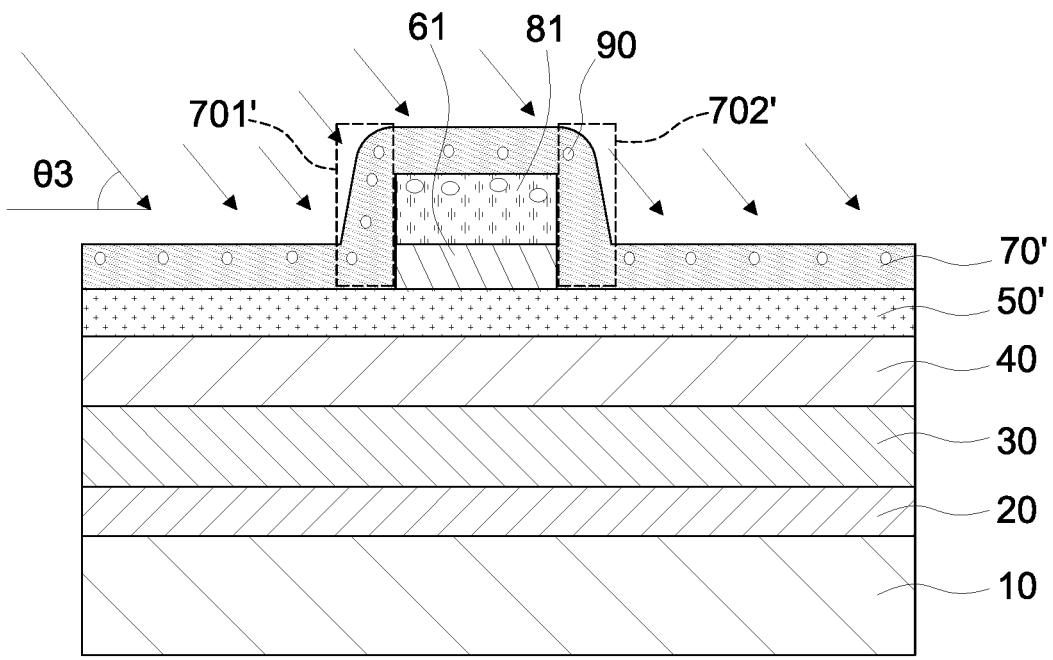

Referring to FIG. 5D, an implantation technique may be performed. Dopant(s) 90 may be injected into the dielectric layer 70'. The dopant(s) 90 may be injected into the mask layer 81. The dopant(s) 90 may be injected at an angle $\theta 3$ with respect to a direction parallel to the interface between the nitride semiconductor layer 30 and the nitride semiconductor layer 40. The angle $\theta 3$ may range from about 15° to about 85°. After the injection of the dopant(s) 90, the dopant(s) 90 may distribute nonuniformly in the dielectric layer 70' because the dopant(s) 90 are injected at a specific direction. For example, the portion 701', which faces the injection direction of the dopant(s) 90, may have a greater concentration of the dopant(s) 90 than that in the portion 702', which is opposite to the portion 701'. As a result, the portion 701' and the portion 702' may have different etching rates under an etching technique.

Figure 5E:
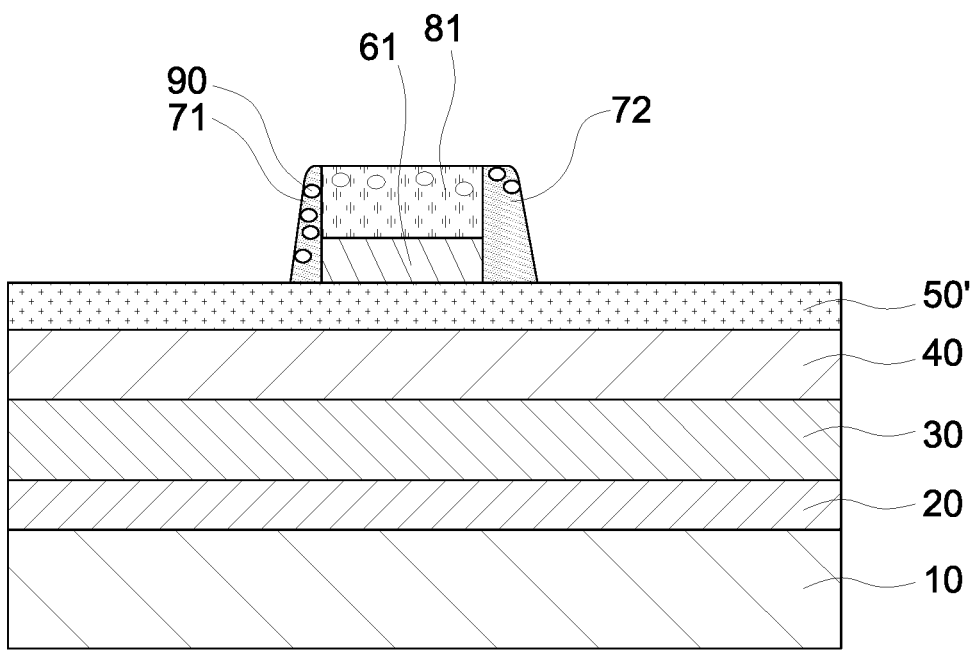

Referring to FIG. 5E, an etching technique may be performed. The dielectric layer 70' may be etched to form the spacer 71 and the spacer 72. The etching technique may include a dry etching technique, a wet etching technique or other suitable techniques.

Figure 5F:
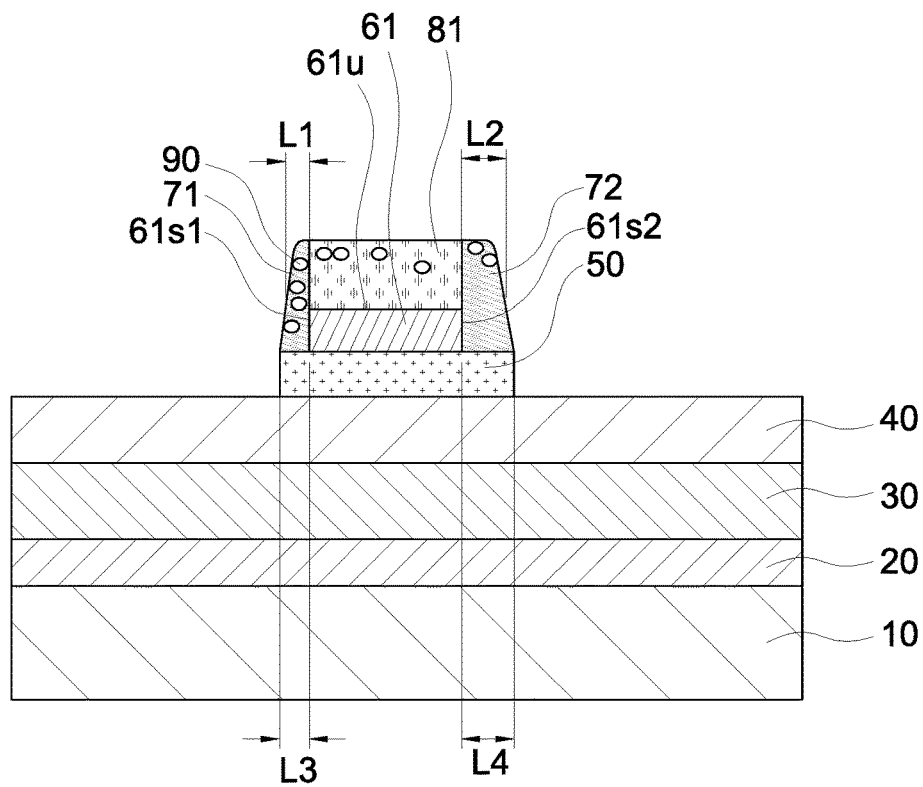

Referring to FIG. 5F, an etching technique may be performed. The semiconductor material 50' may be etched to form the nitride semiconductor layer 50. In this embodiment, the spacer 71 and the spacer 72 may serve as a mask that controls the length L3 and the length L4 of the nitride semiconductor layer 50. In this embodiment, no lithography technique is needed during etching the semiconductor material 50'.

Figure 5G:
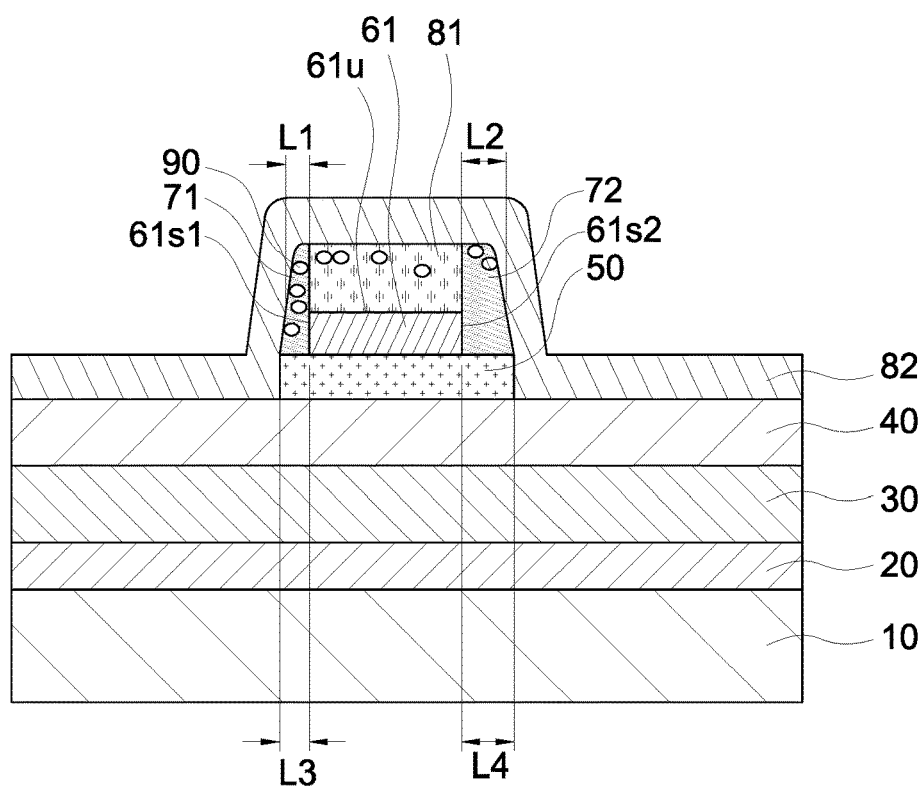

Referring to FIG. 5G, a passivation layer 82 may be formed to cover the nitride semiconductor layer 40, the spacer 71, the spacer 72 and the mask layer 81.

Figure 5H:
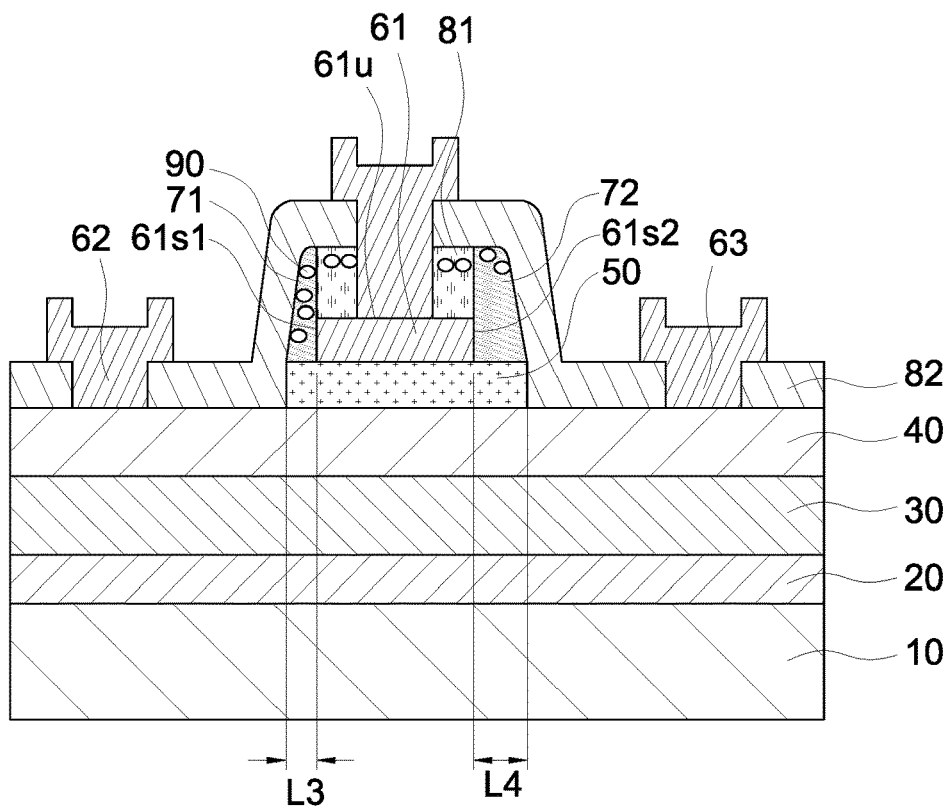

Referring to FIG. 5H, an electrode 62, an electrode 63 and an electrode 64 may be formed to create a semiconductor device structure the same as or similar to the semiconductor device structure 1a described and illustrated in FIG. 1. In a low voltage HEMT, the length L4 may be less than 100 nm, and it is difficult to control such a smaller size by a lithography technique. In this embodiment, the nitride semiconductor layer 50 is formed by a self-aligned etching process, which uses the spacer 71 and the spacer 72 as a mask. The length L4 may be proportional to the thickness of the thickness of the dielectric layer 70'. Therefore, the length L4 may be determined by controlling the thickness of the dielectric layer 70', which is easy to control and has a less process variance. Therefore, the spacer 72 may be formed with a desired length and without using a reticle.

FIG. 6A, FIG. 6B, FIG. 6C and FIG. 6D illustrate various stages of a method for manufacturing a semiconductor device structure in accordance with some embodiments of the present disclosure. The processes before FIG. 6A may be the same as or similar to the processes from FIG. 5A to FIG. 5D, and are not repeated herein.

Figure 6A:
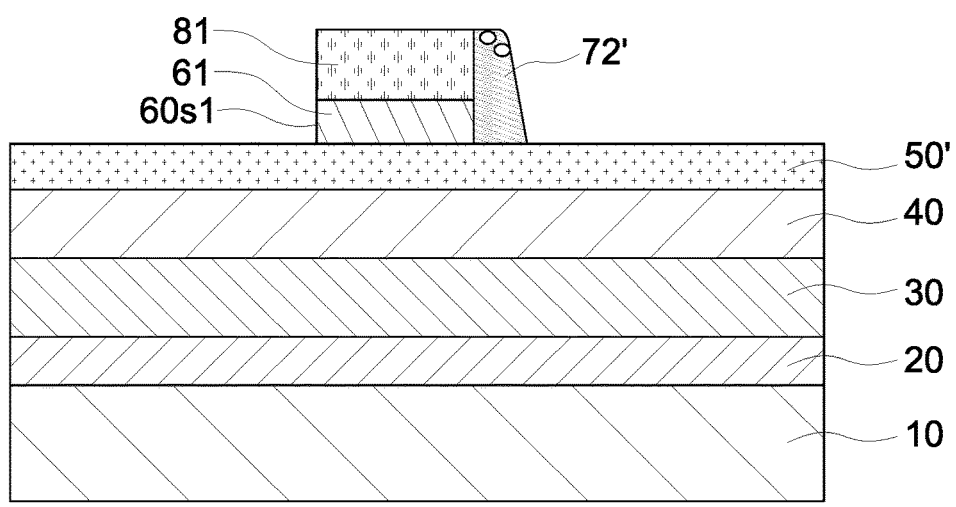
FIG. 6A, FIG. 6B, FIG. 6C and FIG. 6D illustrate various stages of a method for manufacturing a semiconductor device structure in accordance with some embodiments of the present disclosure.

Referring to FIG. 6A, the spacer 72' may be formed. In this embodiment, the portion 701' of the dielectric layer 70' shown in FIG. 5D may be completely removed so that the surface 61s1 of the gate structure 61 may be exposed.

Figure 6B:
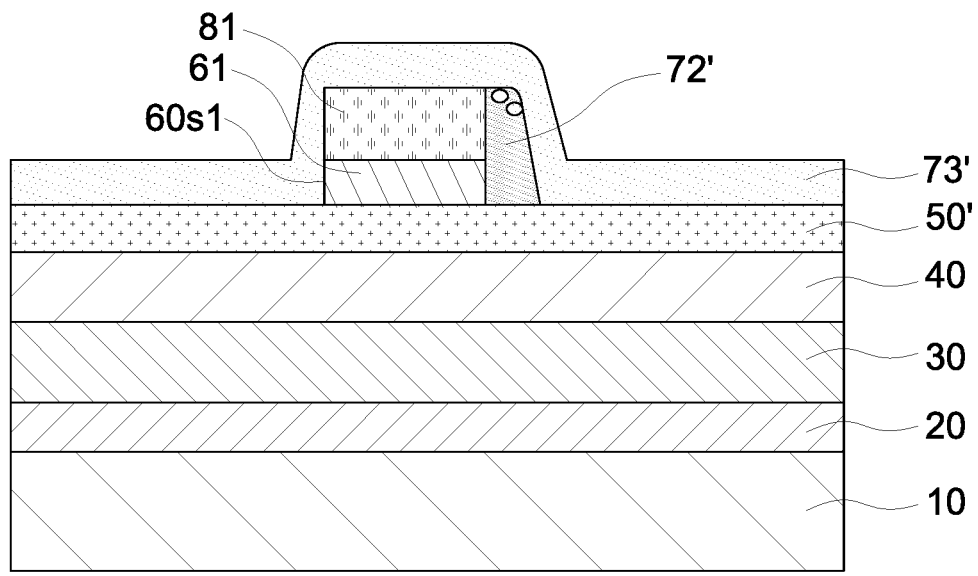

Referring to FIG. 6B, a dielectric layer 73' may be formed on the nitride semiconductor layer 40, the mask layer 81 and the spacer 72'. The dielectric layer 73' may cover the surface 61s1 of the gate structure 61.

Figure 6C:
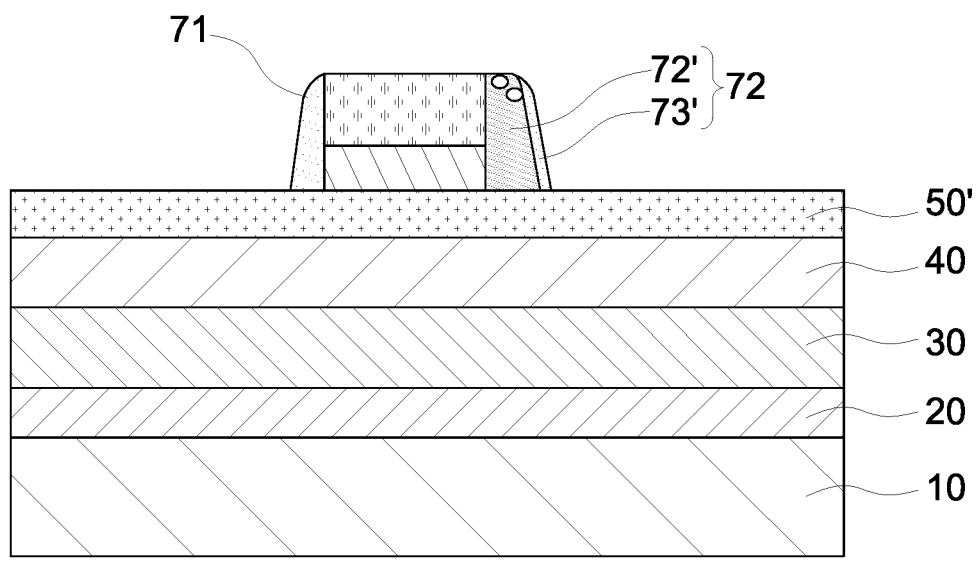

Referring to FIG. 6C, an etching technique may be performed. A portion of the dielectric layer 73' may be removed to form the spacer 71 and the spacer 72. In this embodiment, the spacer 71 may be made of a remaining portion of the dielectric layer 73'. The spacer 72 may be made of a remaining portion of the dielectric layer 70' and a remaining portion of the dielectric layer 73'. Since the dielectric layer 73' may not be injected with the dopant(s) 90, the concentration of the dopant(s) 90 in the spacer 71 may be less than that in the spacer 72.

Figure 6D:
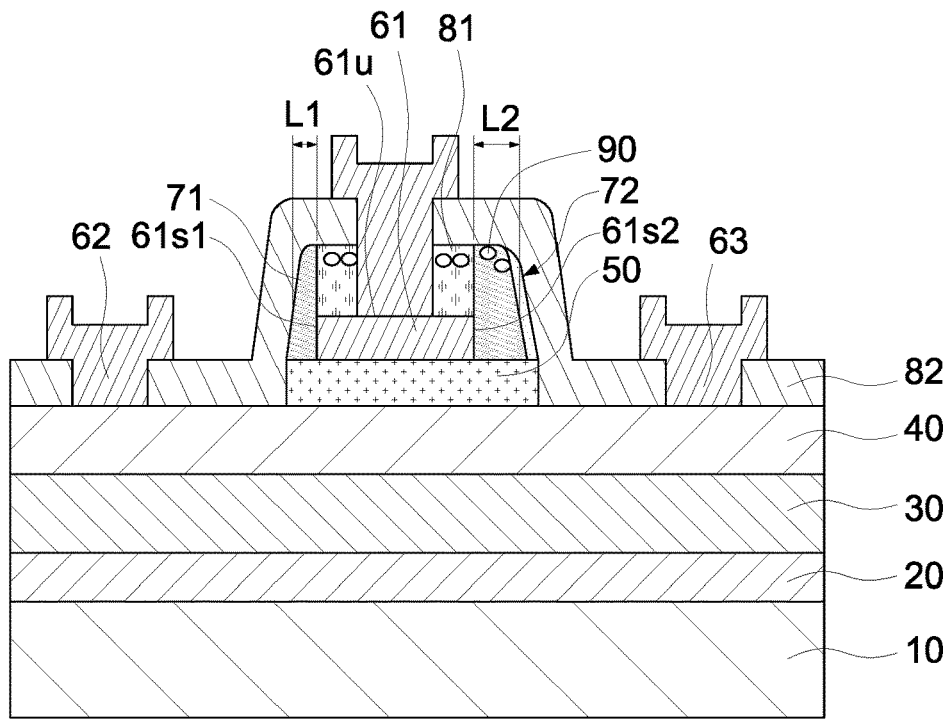

Referring to FIG. 6D, the nitride semiconductor layer 50 may be formed. A mask layer 81, an electrode 62, an electrode 63 and an electrode 64 may be formed to create a semiconductor device structure the same as or similar to the semiconductor device structure 1b described and illustrated in FIG. 2.

FIG. 7A, FIG. 7B, FIG. 7C and FIG. 7D illustrate various stages of a method for manufacturing a comparative semiconductor device structure. The processes before FIG. 6A may be the same as or similar to the processes from FIG. 5A to FIG. 5C, and are not repeated herein.

Figure 7A:
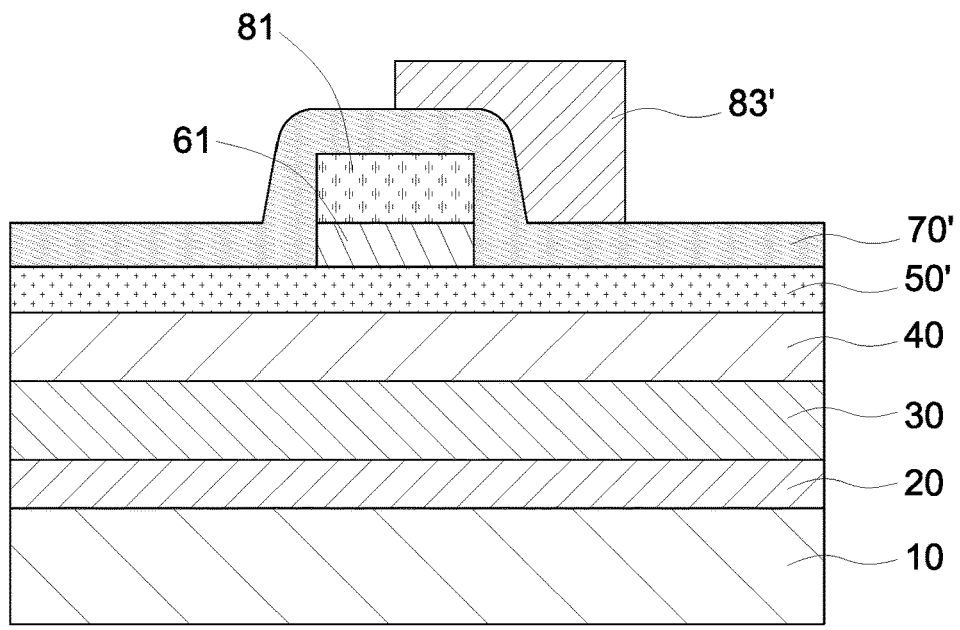
FIG. 7A, FIG. 7B, FIG. 7C and FIG. 7D illustrate various stages of a method for manufacturing a comparative semiconductor device structure.

Referring to FIG. 7A, a photoresist 83' may be formed to cover a portion of the dielectric layer 70'.

Figure 7B:
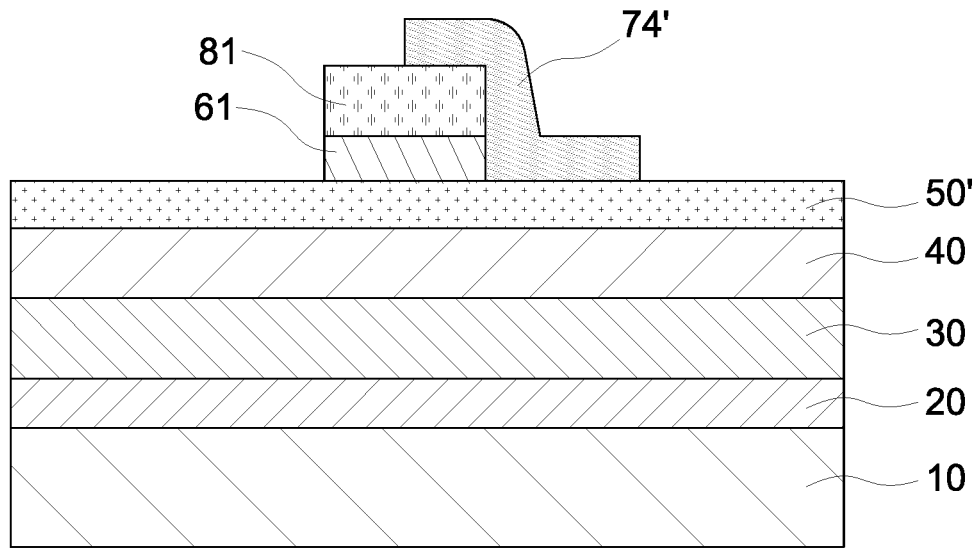

Referring to FIG. 7B, an etching technique may be performed to remove a portion of the dielectric layer 70' and the photoresist 83' may be removed. A spacer 74' may be formed to cover a portion of an upper surface of the mask layer 81.

Figure 7C:
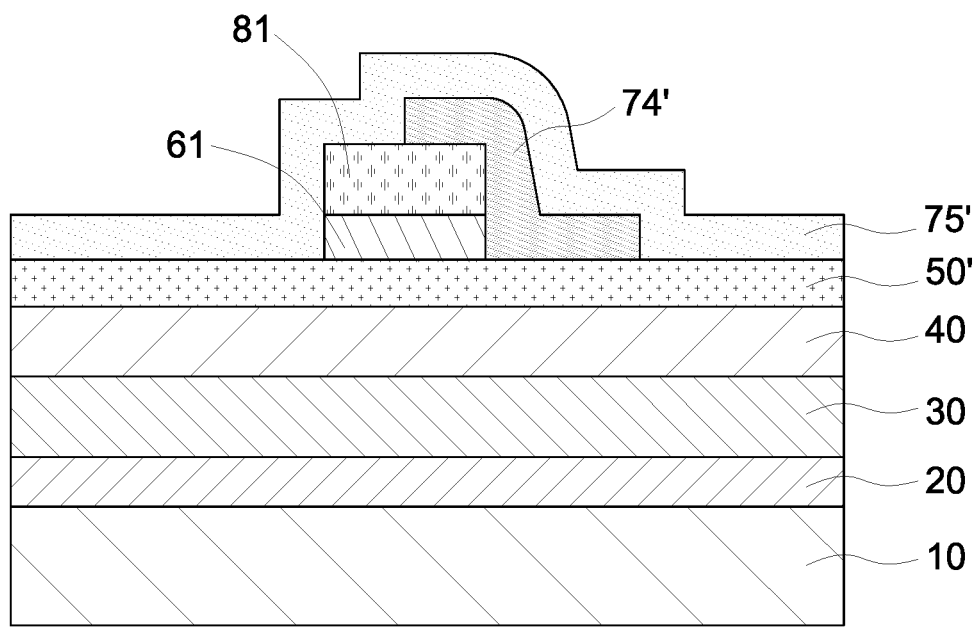

Referring to FIG. 7C, a dielectric layer 75' may be formed to cover a portion of the mask layer 81, the spacer 74' and the nitride semiconductor layer 40.

Figure 7D:
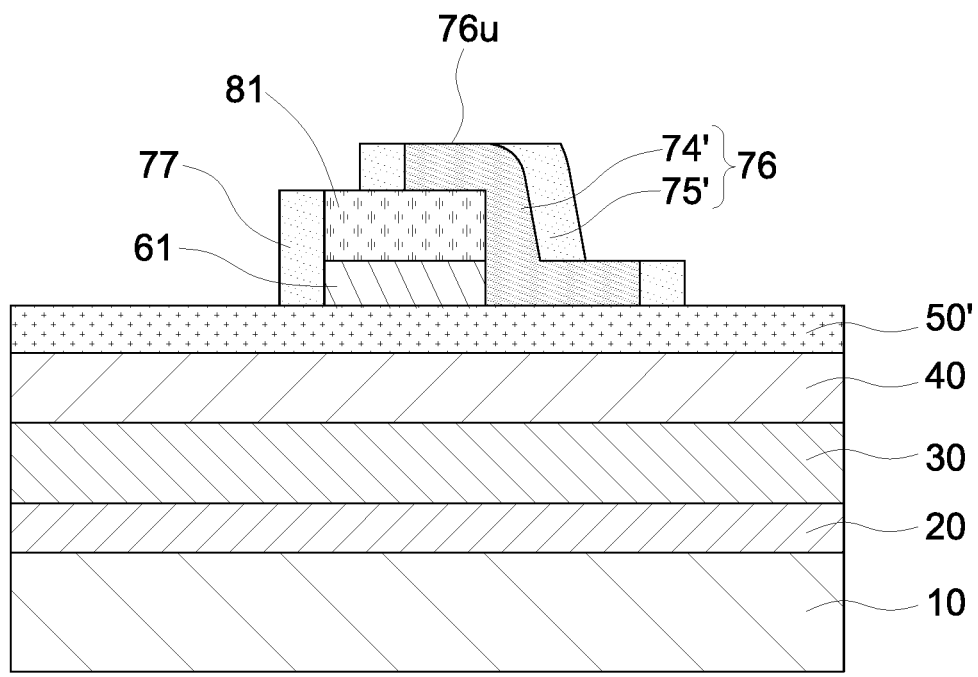

Referring to FIG. 7D, an etching technique may be performed to form a spacer 76 and a spacer 77. The etching technique may include a blanket etching technique. In this comparative example, since an upper surface 76u of the spacer suffer experiences more etching processes, the upper surface 76u the spacer 76 may have a greater roughness, which has a negative influence on layers formed thereon. For example, after the depletion layer is formed, a passivation layer (not shown) may be formed to cover the spacer 76 and the spacer 77. The passivation layer may have a greater roughness due to the rough upper surface 76u of the spacer 76, which may result in a poor accuracy of overlay of a lithography technique. Further, the pattern of the photoresist 83' is determined by a lithography process, which is limited to a lithography equipment. Since a shorter distance is required between the gate structure and the drain electrode, it is crucial to control the length of the spacer and define the profile of the depletion layer. In the comparative example, it is difficult to reduce the length of the spacer 76 because of the limitation of the lithography equipment, and has an adverse effect in a semiconductor device structure with a shorter distance between the gate structure and the drain electrode.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
   a substrate;
   a first nitride semiconductor layer disposed on the substrate;
   a second nitride semiconductor layer disposed on the first nitride semiconductor layer and having a bandgap greater than that of the first nitride semiconductor layer;
   a gate structure disposed on the second nitride semiconductor layer, wherein the gate structure has a first surface and a second surface opposite to the first surface;
   a first spacer disposed adjacent to the first surface of the gate structure;
   a second spacer disposed adjacent to the second surface of the gate structure; and
   a drain electrode disposed relatively adjacent to the second spacer than the first spacer,
   wherein the first spacer has a first length along a first direction parallel to an interface between the first nitride semiconductor layer and the second nitride semiconductor layer, and the second spacer has a second length greater than the first length along the first direction;
   wherein the second spacer comprises a first dopant, the second spacer has a lower portion and an upper portion on the lower portion, and a concentration of the first dopant in the upper portion is greater than that in the lower portion;
   wherein the first spacer has a lateral surface facing away from the gate structure, and the second spacer has a lateral surface facing away from the gate structure, and wherein a first angle between the lateral surface of the first spacer and an imaginary line along a second direction orthogonal to the first direction is less than a second angle between the lateral surface of the second spacer and the imaginary line.

2. The semiconductor device structure of claim 1, wherein the first length is measured at an elevation substantially same as that of an upper surface of the gate structure, and the second length is measured at an elevation substantially same as that of the upper surface of the gate structure.

3. The semiconductor device structure of claim 1, further comprising:

a third nitride semiconductor layer disposed between the second nitride semiconductor layer and the gate structure, wherein the third nitride semiconductor layer has an upper surface and a bandgap less than that of the second nitride semiconductor layer, and wherein the second spacer is in direct contact with and terminated at the upper surface of third nitride semiconductor layer.

4. The semiconductor device structure of claim 1, wherein a concentration of a first dopant in the first spacer is less than a concentration of the first dopant in the second spacer.

5. A semiconductor device structure, comprising:
a substrate;
a first nitride semiconductor layer disposed on the substrate;
a second nitride semiconductor layer disposed on the first nitride semiconductor layer and having a bandgap greater than that of the first nitride semiconductor layer;
a gate structure disposed on the second nitride semiconductor layer, wherein the gate structure has a first surface and a second surface opposite to the first surface; and
a first spacer disposed adjacent to the first surface of the gate structure and comprising a first dopant,
wherein the first spacer has a lower portion and an upper portion on the lower portion, and the first dopant has a greater concentration in the upper portion than the lower portion;
a second spacer disposed on the second surface of the gate structure and comprising the first dopant, wherein a concentration of the first dopant in the second spacer is different from a concentration of the first dopant in the first spacer;
wherein the first spacer has a lateral surface facing away from the gate structure, and the second spacer has a lateral surface facing away from the gate structure, and wherein a first angle constituted by the lateral surface of the first spacer and a second direction orthogonal to an interface between the first nitride semiconductor layer and the second nitride semiconductor layer is greater than a second angle constituted by the lateral surface of the second spacer and the second direction.

6. The semiconductor device structure of claim 5, wherein the first dopant comprises boron, phosphorus, carbon, silicon, antimony, germanium, aluminum, indium, or a combination thereof.

7. The semiconductor device structure of claim 5, wherein the first spacer has a first length along a first direction parallel to an interface between the first nitride semiconductor layer and the second nitride semiconductor layer, and the second spacer has a second length smaller than the first length along the first direction.

8. The semiconductor device structure of claim 5, further comprising:
a mask layer disposed on the gate structure, wherein the concentration of the first dopant in the second spacer is greater than that in the mask layer.

9. The semiconductor device structure of claim 8, further comprising:
a third nitride semiconductor layer disposed between the second nitride semiconductor layer and the gate structure, wherein the third nitride semiconductor layer has a bandgap less than that of the second nitride semiconductor layer, and the first spacer is disposed on the third nitride semiconductor layer and extends across the mask layer and the gate structure.

10. The semiconductor device structure of claim 7, wherein the first length is measured at an elevation substantially same as that of an upper surface of the gate structure, and the second length is measured at the elevation substantially same as that of the upper surface of the gate structure.

11. The semiconductor device structure of claim 9, wherein the third nitride semiconductor layer has an upper surface, and the first spacer and the second spacer are in direct contact with and terminated at the upper surface of the third nitride semiconductor layer.

12. The semiconductor device structure of claim 5, further comprising:
a passivation layer covering the first spacer, wherein a material of the passivation layer is different from that of the first spacer.

13. The semiconductor device structure of claim 5, wherein the concentration of the first dopant in the second spacer is less than the concentration of the first dopant in the first spacer.

14. A method of manufacturing the semiconductor device structure, comprising:
providing a substrate;
forming a first nitride semiconductor layer on the substrate;
forming a second nitride semiconductor layer on the first nitride semiconductor layer, wherein the second nitride semiconductor layer has a bandgap greater than that of the first nitride semiconductor layer;
forming a gate structure on the second nitride semiconductor layer, wherein the gate structure has a first surface and a second surface opposite to the first surface;
forming a first spacer on the first surface of the gate structure; and
forming a second spacer on the second surface of the gate structure, wherein the first spacer has a first length along a first direction parallel to an interface between the first nitride semiconductor layer and the second nitride semiconductor layer, and the second spacer has a second length smaller than the first length along the first direction;
wherein the second spacer comprises a first dopant, the second spacer has a lower portion and an upper portion on the lower portion, and a concentration of the first dopant in the upper portion is greater than that in the lower portion;
wherein the first spacer has a lateral surface facing away from the gate structure, and the second spacer has a lateral surface facing away from the gate structure, and wherein a first angle between the lateral surface of the first spacer and an imaginary line along a second direction orthogonal to the first direction is less than a second angle between the lateral surface of the second spacer and the imaginary line.

15. The method of claim 14, wherein forming the first spacer and the second spacer comprises:
forming a first dielectric material on the gate structure; and
performing an ion implantation process on the first dielectric material, wherein dopants are incident to the first dielectric material with an angle between 15° and 85° with respect to a second direction orthogonal to the interface between the first nitride semiconductor layer and the second nitride semiconductor layer such that a concentration of the dopants in the first dielectric material on the first surface of the gate structure is smaller than that on the second surface of the gate structure; and performing a first etching process on the first dielectric material to form the first spacer and the second spacer.

16. The method of claim 15, further comprises:

forming a second dielectric layer covering the first dielectric material after performing the first etching process; and performing a second etching process on the second dielectric layer to form the first spacer and the second spacer.

* * * * *